(12) United States Patent
Han et al.

(10) Patent No.: US 11,798,957 B2
(45) Date of Patent: Oct. 24, 2023

(54) ARRAY SUBSTRATE, DISPLAY PANEL AND LARGE GLASS PANEL

(71) Applicant: HKC CORPORATION LIMITED, Shenzhen (CN)

(72) Inventors: Bing Han, Shenzhen (CN); Jie Ran, Shenzhen (CN); Lidan Ye, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 347 days.

(21) Appl. No.: 17/362,976

(22) Filed: Jun. 29, 2021

(65) Prior Publication Data

US 2022/0093653 A1    Mar. 24, 2022

(30) Foreign Application Priority Data

Sep. 23, 2020   (CN) .......................... 202011009929.2

(51) Int. Cl.
   *H01L 27/12*        (2006.01)

(52) U.S. Cl.
   CPC ................. *H01L 27/1244* (2013.01)

(58) Field of Classification Search
   CPC ........................ H01L 27/1244; G02F 1/1309
   See application file for complete search history.

(56) References Cited

U.S. PATENT DOCUMENTS

2015/0144915 A1*   5/2015   Lee ................... G02F 1/136204
                                                                     257/40

* cited by examiner

*Primary Examiner* — James A Dudek

(57) ABSTRACT

The present disclosure relates to an array substrate, a display panel, and a large glass panel. The array substrate includes a test structure. The test structure includes a substrate, and a first conductive layer, an insulating layer, a second conductive layer, and a passivation layer sequentially stacked on the substrate. The passivation layer is provided with at least one first groove, at least one second groove, and one third groove. An opening size of the third groove is greater than opening sizes of the at least one first groove and the at least one second groove. The first groove penetrates through the passivation layer and extends to the first conductive layer. The second groove penetrates through the passivation layer and extends to the second conductive layer. The third groove penetrates through the passivation layer and extends to the first conductive layer or the second conductive layer.

14 Claims, 4 Drawing Sheets

ARRAY SUBSTRATE, DISPLAY PANEL AND LARGE GLASS PANEL

CROSS REFERENCE TO RELATED APPLICATIONS

The present disclosure claims the benefit of Chinese Patent Application No. 2020110099292, filed on Sep. 23, 2020, entitled "ARRAY SUBSTRATE, DISPLAY PANEL AND LARGE GLASS PANEL", the entire content of which is incorporated herein in its entirety.

FIELD

The present disclosure relates to the field of display, and more particularly relates to an array substrate, a display panel, and a large glass panel.

BACKGROUND

A process of manufacturing a display device includes process steps, such as plastic frame coating, one drop filling (ODF), alignment assembly, UV light alignment, cutting, polarizer attachment, binding, and the like. After some key processes such as alignment assembly is completed and after cutting, tests are performed to determine whether the current tape-out is normal. If it is normal, the next process is performed, and if it is abnormal, the next process is not performed, avoiding waste of time and cost due to the performing of subsequent manufacturing processes after abnormality. In order to perform the test, a test structure is required to be provided on an array substrate to access test signal, and the test signal is transmitted to the display area by the test structure to drive a switch array of the display area to work. In order to improve the flexibility of the wiring inside the array substrate, two conductive layers are provided inside the test structure, grooves are provided and a test electrode is covered on the top of the test structure, and the test electrode is connected to each conductive layer. One of the conductive layers is selected to be connected to the display area according to the wiring design inside the array substrate, and the external test probe is inserted into the groove and then is in contact with the test electrode, so that the test can be performed. In the current test structure, the above-mentioned grooves have the same size and are arranged in an array. In addition, in order to increase the number of the grooves, the size of the groove is designed to be relatively small, typically on the order of tens of microns, so that the test can be performed with inserting the test probe into one of the grooves at will. However, in a practical operation, when the probe is inserted into the above-mentioned groove for testing, it often occurs that the substrate or the probe is burned at the groove in contact with the probe.

SUMMARY

According to various embodiments of present disclosure, an array substrate, a display panel, and a large glass panel are provided.

An array substrate is provided. The array substrate has a display area and a non-display area surrounding the display area. The array substrate includes a test structure located on the non-display area. The test structure includes, a substrate; a first conductive layer formed on the substrate; an insulating layer formed on the first conductive layer, a second conductive layer formed on the insulating layer, one of the first conductive layer and the second conductive layer being connected to the display area as a signal output terminal, and a passivation layer formed on the second conductive layer, and the passivation layer is provided with at least one first groove, at least one second groove, and one third groove, an opening size of the third groove is greater than an opening size of the at least one first groove and an opening size of the at least one second groove, the at least one first groove penetrates through the passivation layer and extends to the first conductive layer, the at least one second groove penetrates through the passivation layer and extends to the second conductive layer, the third groove penetrates through the passivation layer and extends to the first conductive layer or the second conductive layer, and the opening size of the third groove is greater than or equal to 300 μm, and a test electrode formed on the passivation layer, and covering inner walls of the at least one first groove, the at least one second groove, and the third groove, to connect the first conductive layer and the second conductive layer.

In one embodiment, openings of the first groove and the second groove have the same shape. The first groove and the second groove are alternately arranged, and a distance between the first groove and the second groove adjacent to each other is constant.

In one embodiment, an opening shape of the third groove and opening shapes of the first groove and the second groove are rectangular. The first groove and the second groove are disposed in an array on a side of the third groove. A groove distribution region provided with the first groove, the second groove, and the third groove is a square distribution region.

In one embodiment, the third groove is located in a middle position of the square distribution region, and both the first groove and the second groove are symmetrically disposed on two opposite sides of the third groove.

In one embodiment, in an arrangement direction of the first groove, the second groove, and the third groove, the square distribution region has a length of D1, the third groove has a length of D2, and 500 μm≤D1≤1000 μm, ¾≤D2/D1≤¹¹⁄₁₂.

In one embodiment, the array substrate includes a scan line and a data line located on the display area. The array substrate includes a first group of the test structures and a second group of the test structures. A signal output terminal of the first group of the test structures is connected to the scan line, and a signal output terminal of the second group of the test structures is connected to the data line.

In one embodiment, the scan line and the first conductive layer are located on the same layer, and the data line and the second conductive layer are located on the same layer. The first group of the test structures is connected to the scan line with the first conductive layer in the first group of the test structures as a signal output terminal, and the second group of the test structures is connected to the data line with the second conductive layer in the second group of the test structures as a signal output terminal.

In one embodiment, the array substrate further includes a common electrode located on the display area. The array substrate further includes a third group of the test structures, and a signal output terminal of the third group of the test structures is connected to the common electrode on the display area.

In one embodiment, each group of the test structures at least includes two test structures adjacent to both ends of the display area.

In one embodiment, the array substrate includes a pixel electrode located on the display area, the pixel electrode and the test electrode are located on the same layer.

In one embodiment, both the test electrode and the pixel electrode are indium tin oxide.

In one embodiment, both the first conductive layer and the second conductive layer are metal layers.

A display panel includes an array substrate and a color film substrate that are oppositely disposed. The array substrate is the array substrate according to any one of the above embodiments.

A large glass panel includes test wiring extending to an edge of the large glass panel and display panels. Each of the display panels is the above-mentioned display panel. A first conductive layer or a second conductive layer of a test structure in each of the display panels is connected to the test wiring to obtain a test signal from the test wiring.

The aforementioned array substrate includes the test structure, which is provided with grooves, a part of the grooves extend to the first conductive layer, and a part of the grooves extend to the second conductive layer. After the test electrode is covered, both the first conductive layer and the second conductive layer are in contact with the test electrode to be connected with each other. After the test probe is inserted into the grooves and connected to the test electrode, both the first conductive layer and the second conductive layer can be used as signal output terminals to be connected to the display area to achieve the transmission of test signals for testing. In the present disclosure, the opening size of the third groove is greater than or equal to 300 μm, and the opening size of the at least one first groove and the at least one second groove is less than that of the third groove, and is as small as several microns or tens of microns. By optimizing the arrangement and size of the grooves, the third groove is used as the connection area with the test probe. Experiments show that the above-mentioned burn phenomenon do not occur after the test probe is inserted into the above-mentioned third groove.

The details of one or more embodiments of the disclosure are set forth in the accompanying drawings and the description below. Other embodiments of the disclosure will be apparent from the description and drawings, and from the claims.

BRIEF DESCRIPTION OF THE DRAWINGS

To illustrate the embodiments of the present disclosure more clearly, the accompanying drawings for describing the embodiments are introduced briefly in the following.

FIG. 2b is a side sectional view corresponding to a section AA' in FIG. 2a.

FIG. 3b is a side sectional view corresponding to a section AA' in FIG. 3a.

DETAILED DESCRIPTION OF THE EMBODIMENTS

In order to facilitate understanding of the present disclosure, the present disclosure will be described more fully below with reference to the accompanying drawings.

Embodiments of the present disclosure are given in the accompanying drawings. However, the present disclosure may be implemented in many different forms and is not limited to the embodiments described herein. Rather, the purpose of these embodiments is to make the disclosure of this application more thorough and complete.

Unless defined otherwise, terms used herein have the same meaning as commonly understood by within the field to which this application belongs. The terminology used in the specification of this application is for the purpose of describing specific examples only and is not intended to limit the application. As used herein, the term "and/or" includes any and all combinations of one or more of the relevant listed items.

It should be noted that when an element is referred to as being "connected" or "coupled" to another element, it can be directly connected or coupled to the other element or intervening elements may be present.

Figure 1:
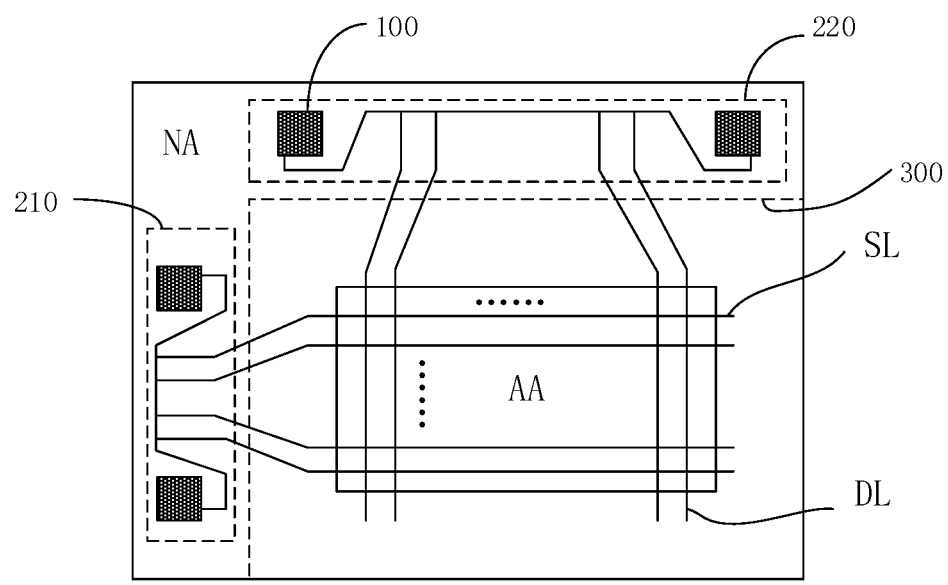
FIG. 1 is a schematic view of an array substrate according to an embodiment of the present disclosure.
Figure 2A:
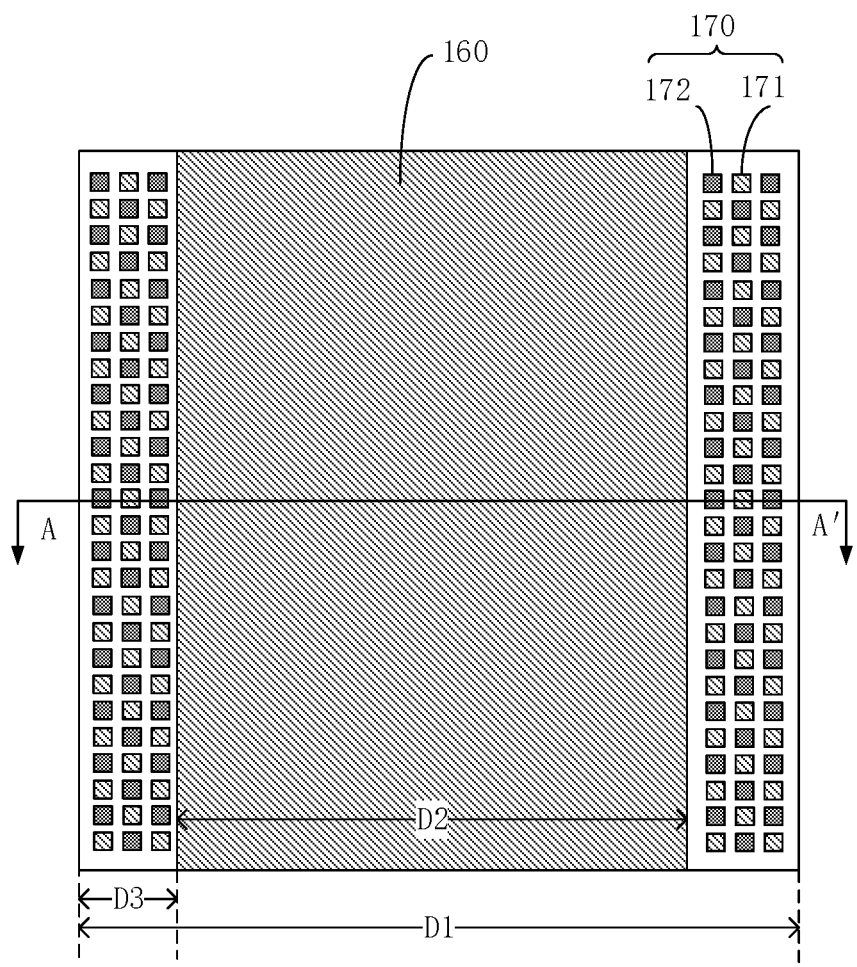
FIG. 2a is a top plan view illustrating a distribution of each groove in a test structure according to an embodiment of the present disclosure.
Figure 2B:
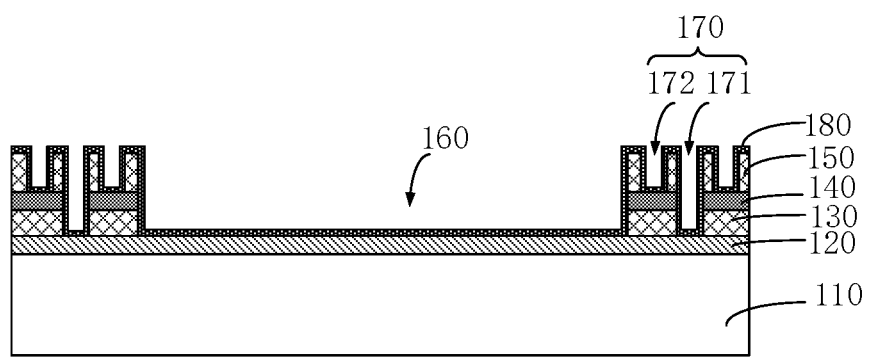

In one embodiment, as shown in FIG. 1, an array substrate has a display area AA located in a middle region and a non-display area NA surrounding the display area AA, and the array substrate includes a test structure 100 located on the non-display area NA. Referring to FIG. 2a and FIG. 2b, the test structure 100 includes a substrate 110. A first conductive layer 120 is formed on the substrate 110, an insulating layer 130 is formed on the first conductive layer 120, and a second conductive layer 140 is formed on the insulating layer 130. Both the first conductive layer and the second conductive layer may be metal layers with better conductive properties. A passivation layer 150 is formed on the second conductive layer 140. The passivation layer 150 is provided with at least one first groove 171, at least one second groove 172, and one third groove 160. The at least one first groove 171 sequentially penetrates through the passivation layer 150, the second conductive layer 140, and the insulating layer 130 and stops at the first conductive layer 120, and the at least one second groove 172 penetrates through the passivation layer 150 and stops at the second conductive layer 140. Namely, the bottom of the first groove 171 is the first conductive layer 120, and the bottom of the second groove 172 is the second conductive layer 140. The third groove 160 penetrates through the passivation layer 150 and extends to the first conductive layer 120 or the second conductive layer 140. An opening size of the third groove 160 is greater than an opening size of the at least one first groove 171 and an opening size of the at least one second groove 172, and the opening size of the third groove 160 is specifically greater than or equal to 300 μm. The passivation layer 150 is further formed with a test electrode 180. The test electrode 180 covers inner walls of the at least one first groove 171, the at least one second groove 172, and the third groove 160, connecting the first conductive layer 120 and the second conductive layer 140. The first conductive layer 120 or the second conductive layer 140 in the above-mentioned test structure 100 is used as a signal output terminal of the test structure 100 to be connected to the display area to transmit a test signal to the display area AA. It should be noted that the above-mentioned opening size of the groove refers to the minimum opening width of the groove. When the groove is circular, the opening size refers to a diameter of the circle. When the groove is rectangular, the opening size refers to a side length of the shortest side of the rectangle.

In the present disclosure, the array substrate is provided with a test structure in the non-display area thereof, and the test structure is connected to the display area of the array substrate. It can be understood that the connection to the display area refers to the connection to the structure to be tested in the display area. Since both the first conductive layer and the second conductive layer are connected to the test electrode, the first conductive layer and the second conductive layer are actually electrically coupled to each other, and any conductive layer between the first conductive layer and the second conductive layer can be used as the signal output terminal of the test structure to be connected to the display area, which is required to be specifically set according to the overall wiring inside the array substrate. After the test probe is inserted into the groove, the test signal is transmitted to the structure to be tested in the display area by the test structure, so that the test can be realized. The present disclosure optimizes the distribution and size of the grooves. In one embodiment, the opening size of one of the grooves is increased to form the third groove with a larger opening size, and the other grooves have a smaller opening size. The opening size of the third groove 160 is greater than or equal to 300 μm. After the opening size of the third groove is satisfied, the opening size of the other grooves can be as small as possible, as long as it can be implemented by the current photolithography process, to reduce the occupied area of the test structure. In case of using the third groove as the region in contact with the probe, the experiment shows that, when the test probe is inserted into the third groove for testing after the above-mentioned optimization of the groove, the burn phenomenon described above does not occur, so that the normal progress of the test can be ensured, and the yield of the product can be improved.

Figure 3A:
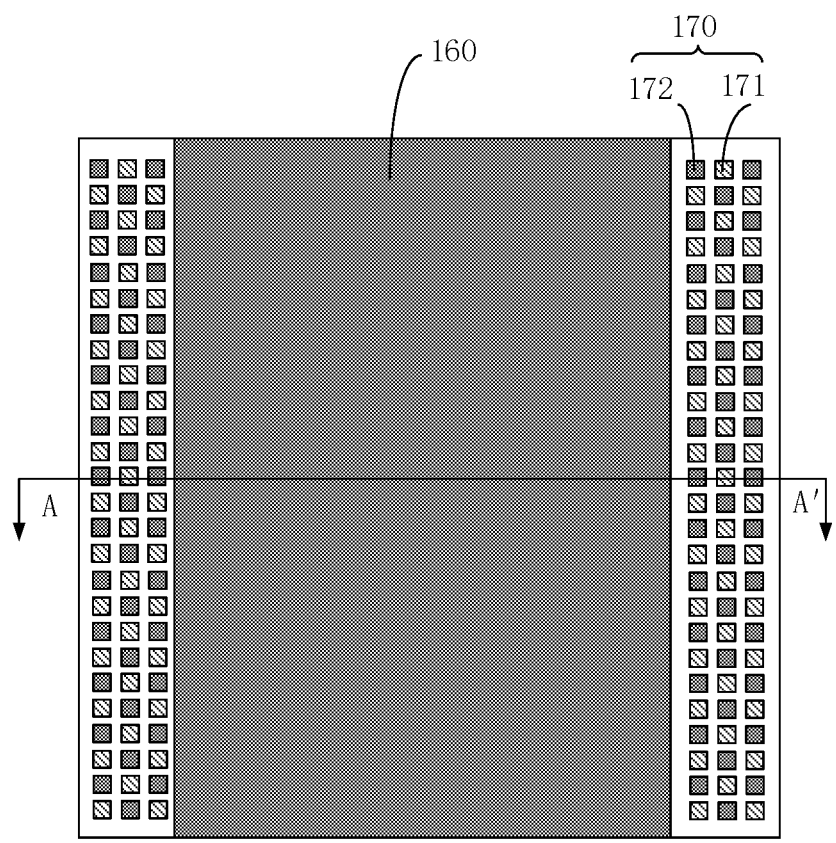
FIG. 3a is a top plan view illustrating a distribution of each groove in a test structure according to another embodiment of the present disclosure.
Figure 3B:
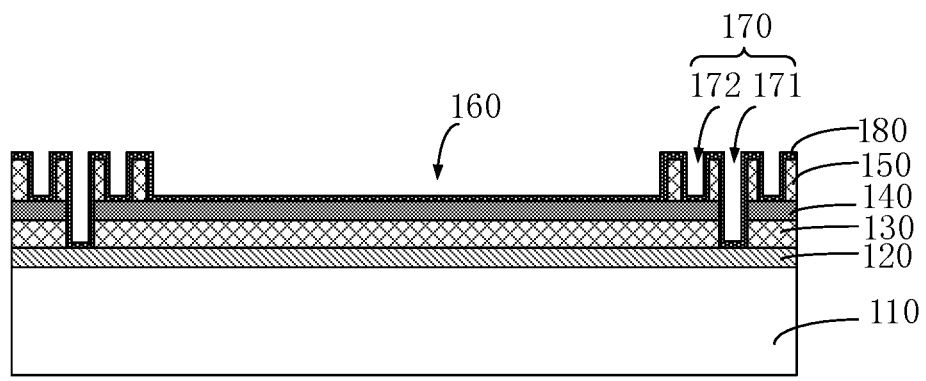

In one embodiment, as shown in FIGS. 2a and 2b, the third groove 160 sequentially penetrates through the passivation layer 150, the second conductive layer 140, and the insulating layer 130, and stops at the first conductive layer 120. In another embodiment, as shown in FIGS. 3a and 3b, the third groove 160 penetrates through the passivation layer 150 and stops at the second conductive layer 140. Since the test electrode 180 covers the first grooves, the second grooves, and the third groove, the third groove is connected to the test probe, and the first conductive layer 120 and the second conductive layer 140 are both charged.

In some embodiments, in addition to optimizing the size of the third groove, the distribution of the first and second grooves is also optimized. In a specific embodiment, as shown in FIG. 2b, the openings of the first grooves 171 and the second grooves 172 have the same shape, the first grooves 171 and the second grooves 172 are alternatively arranged, and a distance between the first groove 171 and the second groove 172 adjacent to each other is constant. In the present embodiment, in a distribution region of the first grooves and the second grooves, the contact area of the test electrode with the first conductive layer and the second conductive layer is constant, and the first grooves and the second grooves are uniformly distributed, so that the distribution of the electrical signals accessed by the first conductive layer and the distribution of the electrical signals accessed by the second conductive layer are more uniform, improving the stability of the test.

In one embodiment, as shown in FIG. 2a, the test structure 100 has one third groove 160, first grooves 171, and second grooves 172. The opening of the third groove 160 and the openings of the first grooves 171 and the second grooves 172 all have a rectangular shape, and the first grooves 171 and the second grooves 172 are disposed in an array on a side of the third groove 160, so that a groove distribution region enclosed by the first grooves 171, the second grooves 172, and the third groove 160 is a square distribution region. In the present embodiment, the openings of the first grooves 171, the second grooves 172, and the third groove 160 are rectangular, and the groove distribution region is square, so that the grooves are simple in shape and arranged neatly, facilitating simplification of the manufacturing process. In one embodiment, the third groove 160 may be located in the middle position of the above-mentioned square distribution region, and both the first grooves 171 and the second grooves 172 are symmetrically disposed on two opposite sides of the third groove 160. The third groove 160 is used as the region in which the test probe is inserted, and disposed in the middle region of the test structure, which conforms to the alignment habit of inserting the test probe into the middle position of the test structure, so that the test probe can be more accurately inserted into the third groove 160. In one embodiment, when the first grooves 171 and the second grooves 172 are disposed on two opposite sides of the third groove 160, in a direction perpendicular to the sides, the square distribution region has a length of D1, the third groove has a length of D2, and the groove distribution region of the first grooves and the second grooves has a length of D3, then $500 \leq \mu m\ D1 \leq 1000\ \mu m$, $\sqrt[3]{4} \leq D2/D1 \leq \sqrt[11]{12}$, and $\sqrt[1]{12} \leq 2*D3/D1 \leq \sqrt[1]{4}$ are satisfied. Experiments show that when the size of the test structure meets the above conditions, the test probe can be rapidly aligned with the third groove and no burns occur during the test, and the overall occupied space of the test structure is also small.

In one embodiment, the display area includes a switch array, in particular a thin film transistor array, and the display area further includes scan lines and data lines. As shown in FIG. 1, the scan lines SL and the data lines DL are located at different levels and interlaced crosswise. The scan lines SL are connected to a control terminal of the switch array, and the data lines DL are connected to an input terminal of the switch array. The array substrate includes at least two groups of the above-mentioned test structures, which are a first group of test structures 210 and a second group of test structures 220, respectively. The signal output terminals of the first group of test structures 210 are connected to the scan lines SL, and the signal output terminals of the second group of test structures 220 are connected to the data lines DL. In the present embodiment, test signals can be supplied to the switch array in the display area by connecting the first group of test structures and the second group of test structures to the scan lines and the data lines, respectively, making the switch array work, determining whether the switch array is normal, and completing the test.

In one embodiment, the scan lines SL in the display area may be located on the same layer as the first conductive layer 120 in the test structure, and the data lines DL in the display area may be located on the same layer as the second conductive layer 140 in the test structure. When designing the wiring, specifically, the first conductive layer 120 in the first group of test structures 210 may be connected to the scan lines SL as a signal output terminal, and the second conductive layer 140 in the second group of test structures 220 may be connected to the data lines DL as a signal output terminal. In the present embodiment, when the two structures required to be connected are located at the same layer, the wiring can be performed at the present level without designing the via holes, and in the manufacturing process, the connection wiring and the structures at both ends of the connection wiring can be formed by a single photolithography process, simplifying the process steps. In other embodiments, when the wiring of the array substrate is complicated and cross-wiring is involved, the first test structure 210 may also take the second conductive layer 140 thereof as a signal output terminal, the connection wiring is led out from the second conductive layer 140 and connected to the scan lines SL through the via hole. Similarly, the second test structure 220 may take the first conductive layer 120 thereof as a signal output terminal, and the connection wiring is led out from the first conductive layer 120 and connected to the data lines DL through the via hole.

In one embodiment, the display area further includes a common electrode. At this time, the non-display area further includes a third group of test structures whose signal output terminals are connected to the common electrode of the display area to supply test signals to the common electrode.

In one embodiment, as shown in FIG. 1, each group of the test structures described above may include at least two test structures, which are proximate to both ends of the display area AA, respectively. For example, two test structures in the first group of test structures 210 are proximate to both ends of the display area AA, respectively, and one of the test structures is proximate to the first scan line and the other test structure is proximate to the last scan line, and the test structures at both ends are connected to the scan lines. The two test structures in the second group of test structures 220 are proximate to both ends of the display area AA, respectively, and one of the test structures is proximate to the first data line and the other test structure is proximate to the last data line, and the test structures at both ends are connected to the data lines. Since the signals will be attenuated in the transmission process, the longer the wiring is, the more serious the attenuation is, so that the signals received at different positions in the display area are not uniform. In the present embodiment, the number and the positions of the test structures in each group of test structures are limited, so that the signal distribution of each scan line and each data line in the display area is more uniform, and the reliability of the test is improved.

In one embodiment, the display area includes a pixel electrode. The test structure transmits the test signal to the display area, so that the pixel electrode is finally charged. After the pixel electrode is charged, a potential difference is formed between the common electrode on the color film substrate and the pixel electrode to control the liquid crystal to deflect, so that light is transmitted through the panel to illuminate the panel. Therefore, in the test, it is only necessary to determine whether the position is abnormal by checking whether the corresponding position of the panel is illuminated. In the present embodiment, the pixel electrode and the test electrode are located in the same layer, and in the specific manufacturing process, the pixel electrode and the test electrode can be simultaneously formed by a single photolithography process, simplifying the process steps. In one embodiment, the above-mentioned pixel electrode and test electrode are both indium gallium zinc oxide (ITO), and the ITO has good electrical conductivity and is made of transparent material. By using the ITO as the pixel electrode, the aperture ratio of the pixel is increased while ensuring the electron transmission capability.

The present disclosure also relates to a display panel including an array substrate and a color film substrate that are oppositely disposed. The array substrate is any one of the array substrates described above. As shown in FIG. 1, the color film substrate is disposed at a position corresponding to a dotted line frame 300, so that a test structure 100 is exposed outside the color film substrate to facilitate the access by a test probe.

Figure 4:
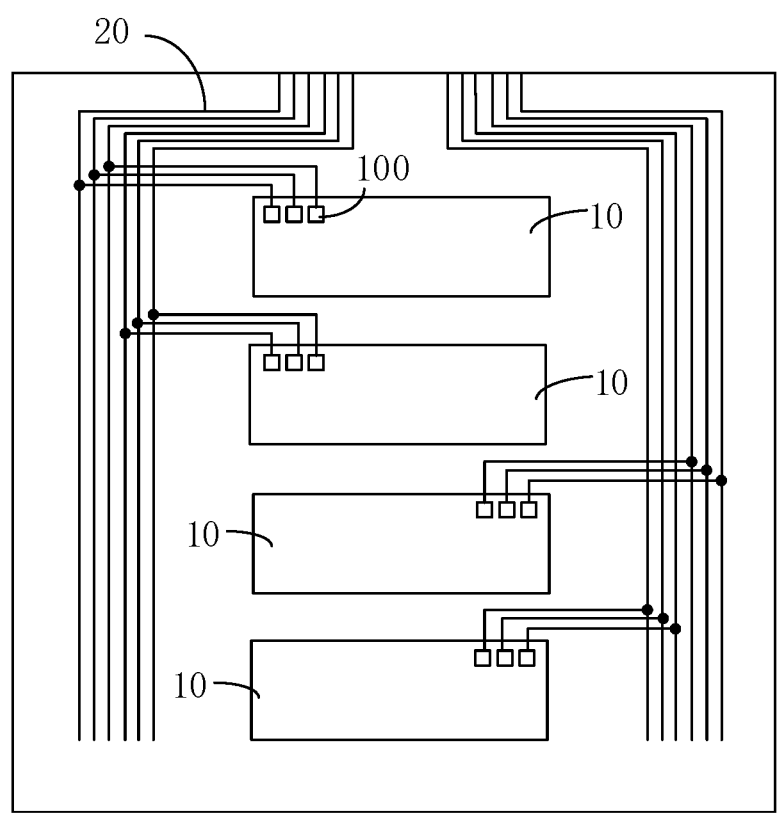
FIG. 4 is a schematic view of a large glass panel according to an embodiment of the present disclosure.

The present disclosure also relates to a large glass panel. As shown in FIG. 4, the large glass panel includes test wiring 20 extending to edges of the large glass panel and display panels described above. Each of the display panels 10 is provided with a test structure 100, a first conductive layer or a second conductive layer in the test structure 100 is connected to the test wiring 20 to obtain a test signal from the test wiring 20. In the present disclosure, before cutting the large glass panel, each display panel 10 in the large glass panel is required to be tested. At this time, since the large glass panel is covered with an entire piece of color film substrate, it is impossible to connect the test probe to the test structure 100 in the display panel 10, so that the test structure 100 needs to obtain a test signal through the test wiring extending to the edge of the large glass panel. In one embodiment, the test wiring 20 are arranged in parallel, and the connection between each test structure and test wiring generally involves a cross-wiring situation. When the cross-wiring is encountered, the test wiring and the connection wires connected to the test structures need to be arranged at different levels and connected with each other through via holes. For example, the test wiring 20 and the first conductive layer in the test structure 100 are located at the same level, and the connection wires are led out of the second conductive layer in the test structure 100 and connected to the test wiring 20 through the via holes, and the test structure 100 may take the first conductive layer or the second conductive layer as the signal output terminal to lead out the connection wires to be connected to the display area. Therefore, the test structure is provided with double conductive layers, and the flexible arrangement of the connection wires can be achieved. In one embodiment, the first conductive layer in the test structure 100 leads out the connection wires to be connected to the test wiring, and the third groove in the test structure 100 penetrates through the passivation layer and extends to the first conductive layer to increase the contact area of the electrical connection. In another embodiment, the second conductive layer in the test structure 100 leads out the connection wires to be connected to the test wiring, and the third groove in the test structure 100 penetrates through the passivation layer and extends to the second conductive layer to increase the contact area of the electrical connection.

What is claimed is:

1. An array substrate, having a display area and a non-display area surrounding the display area, the array substrate comprising a test structure located on the non-display area, the test structure comprising:
   a substrate;
   a first conductive layer formed on the substrate;
   an insulating layer formed on the first conductive layer;
   a second conductive layer formed on the insulating layer, one of the first conductive layer and the second conductive layer being connected to the display area as a signal output terminal, and
   a passivation layer formed on the second conductive layer,
   wherein the passivation layer is provided with at least one first groove, at least one second groove, and one third groove; an opening size of the third groove is greater than an opening size of at least one first groove and an opening size of the at least one second groove, the at least one first groove penetrates through the passivation layer and extends to the first conductive layer, the at least one second groove penetrates through the passivation layer and extends to the second conductive layer, the third groove penetrates through the passivation layer and extends to the first conductive layer or the second conductive layer, and the opening size of the third groove is greater than or equal to 300 μm;

a test electrode formed on the passivation layer, and covering inner walls of the at least one first groove, the at least one second groove, and the third groove, to connect the first conductive layer and the second conductive layer.

2. The array substrate of claim 1, wherein openings of the first groove and the second groove have the same shape, the first groove and the second groove are alternately arranged, and a distance between the first groove and the second groove adjacent to each other is constant.

3. The array substrate of claim 1, wherein an opening shape of the third groove and opening shapes of the first groove and the second groove are rectangular, the first groove and the second groove are disposed in an array on a side of the third groove, and a groove distribution region provided with the first groove, the second groove, and the third groove is a square distribution region.

4. The array substrate of claim 3, wherein the third groove is located in a middle position of the square distribution region, and both the first groove and the second groove are symmetrically disposed on two opposite sides of the third groove.

5. The array substrate of claim 3, wherein in an arrangement direction of the first groove, the second groove, and the third groove, the square distribution region has a length of D1, the third groove has a length of D2, and 500 µm≤D1≤1000 µm, $3/4 \leq D2/D1 \leq 11/12$.

6. The array substrate of claim 1, wherein the array substrate comprises a scan line and a data line located on the display area, the array substrate comprises a first group of test structures and a second group of the test structures, a signal output terminal of the first group of the test structures is connected to the scan line, and a signal output terminal of the second group of the test structures is connected to the data line.

7. The array substrate of claim 6, wherein the scan line and the first conductive layer are located on the same layer, the data line and the second conductive layer are located on the same layer, the first group of the test structures is connected to the scan line with the first conductive layer in the first group of the test structures as a signal output terminal, and the second group of the test structures is connected to the data line with the second conductive layer in the second group of the test structures as a signal output terminal.

8. The array substrate of claim 6, wherein the array substrate further comprises a common electrode located on the display area, the array substrate further comprises a third group of the test structures, and a signal output terminal of the third group of the test structures is connected to the common electrode on the display area.

9. The array substrate of claim 6, wherein each group of the test structures at least comprises two test structures adjacent to both ends of the display area.

10. The array substrate of claim 1, wherein the array substrate comprises a pixel electrode located on the display area, the pixel electrode and the test electrode are located on the same layer.

11. The array substrate of claim 10, wherein both the test electrode and the pixel electrode are indium tin oxide.

12. The array substrate of claim 1, wherein both the first conductive layer and the second conductive layer are metal layers.

13. A display panel, comprising an array substrate of claim 1 and a color film substrate that are disposed oppositely.

14. A large glass panel, comprising a plurality of test wiring extending to an edge of the large glass panel and a plurality of display panels of claim 13, a first conductive layer or a second conductive layer of a test structure in each of the display panels being connected to test wiring to obtain a test signal from the test wiring.

* * * * *